United States Patent
Tang

(10) Patent No.: US 11,362,163 B2
(45) Date of Patent: Jun. 14, 2022

(54) DISPLAY PANEL HAVING INCREASED CONDUCTORIZED AREA OF AN ACTIVE LAYER, PREPARING METHOD THEREOF, AND DISPLAY DEVICE EMPLOYING THE DISPLAY PANEL

(71) Applicant: Shenzhen China Star Optoelectronics Semiconductor Display Technology Co., Ltd., Shenzhen (CN)

(72) Inventor: Jia Tang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 187 days.

(21) Appl. No.: 16/758,533

(22) PCT Filed: Mar. 10, 2020

(86) PCT No.: PCT/CN2020/078508
§ 371 (c)(1),
(2) Date: Apr. 23, 2020

(87) PCT Pub. No.: WO2021/168904
PCT Pub. Date: Sep. 2, 2021

(65) Prior Publication Data
US 2022/0045153 A1 Feb. 10, 2022

(30) Foreign Application Priority Data
Feb. 25, 2020 (CN) .......................... 202010116241.8

(51) Int. Cl.
*H01L 29/08* (2006.01)
*H01L 27/32* (2006.01)
*H01L 51/52* (2006.01)
*H01L 51/56* (2006.01)

(52) U.S. Cl.
CPC ...... *H01L 27/3272* (2013.01); *H01L 27/3246* (2013.01); *H01L 27/3258* (2013.01); *H01L 27/3265* (2013.01); *H01L 51/5253* (2013.01); *H01L 51/56* (2013.01); *H01L 2251/308* (2013.01)

(58) Field of Classification Search
CPC ............. H01L 27/3272; H01L 27/3246; H01L 27/3265; H01L 51/5253; H01L 2251/308
USPC .......................................................... 257/40
See application file for complete search history.

(56) References Cited

U.S. PATENT DOCUMENTS

| 2016/0093647 A1* | 3/2016 | Kim ................... H01L 29/66757 349/46 |
| 2018/0069069 A1* | 3/2018 | Ebisuno ............. H01L 27/3246 |
| 2018/0175077 A1* | 6/2018 | Koo ..................... H01L 27/1251 |
| 2019/0189722 A1* | 6/2019 | Lim ..................... H01L 27/1244 |

* cited by examiner

Primary Examiner — Phuc T Dang

(57) ABSTRACT

A display panel, a method for preparing a display panel, and a display device are disclosed. The display panel includes a substrate layer; a light shielding metal layer and a first electrode plate of a storage capacitor on the substrate layer; a buffer layer covering the light shielding metal layer and the first electrode plate on the substrate layer; an active layer and a second electrode plate of the storage capacitor on the buffer layer; a gate insulating layer on the buffer layer and the active layer, and a source, a gate and a drain on the gate insulating layer.

20 Claims, 3 Drawing Sheets

DISPLAY PANEL HAVING INCREASED CONDUCTORIZED AREA OF AN ACTIVE LAYER, PREPARING METHOD THEREOF, AND DISPLAY DEVICE EMPLOYING THE DISPLAY PANEL

RELATED APPLICATIONS

This application is a National Phase of PCT Patent Application No. PCT/CN2020/078508 having International filing date of Mar. 10, 2020, which claims the benefit of priority of Chinese Patent Application No. 202010116241.8 filed on Feb. 25, 2020. The contents of the above applications are all incorporated by reference as if fully set forth herein in their entirety.

FIELD AND BACKGROUND OF THE INVENTION

The present disclosure relates to the technical field of displays, and in particular to a display panel, a preparing method thereof, and a display device.

At present, a thin-film transistor with a top gate structure has a complicated structure and a large number of layers, resulting in high consumption of time costs and material costs, as well as yield loss to a certain degree. Therefore, it is necessary to develop a thin film transistor with a top gate with few preparing processes and desired device functions.

In a conventional technique, new processes for preparing a source, a gate and a drain in a same layer are employed to prepare the display panel. Compared with the number of old processes for preparing the thin-film transistor with the top-gate structure, the new processes save metal film formation, photolithography, etching and interlayer insulating layer formation one time, and greatly saves costs, but there is a large difference, compared with the old processes for preparing the thin-film transistor with the top gate structure, especially an active layer. Because materials of the source, gate and drain are low-impedance metals, dry etching cannot be used. During a wet etching process, a metal etching solution continuously contacts the active layer, resulting in serious damage to a thickness of the active layer, contact resistance, etc. The active layer is subjected to the dry etching processes of the gate insulating layer twice, thereby also damaging the active layer, making the source, the drain and the active layer fail to conduct, and failing to achieve the function of the thin film transistor. Therefore, it is necessary to improve this defect.

SUMMARY OF THE INVENTION

Technical Problems

The present disclosure provides a display panel for solving the technical problem of a conventional display panel that during a wet etching process, a metal etching solution continuously contacts the active layer, resulting in serious damage to a thickness of the active layer, contact resistance, etc. The active layer is subjected to the dry etching processes of the gate insulating layer twice, thereby also damaging the active layer, making the source, the drain and the active layer fail to conduct, and failing to achieve the function of the thin film transistor.

Technical Solutions

An embodiment of the present disclosure provides a display panel including: a substrate layer; a light shielding metal layer and a first electrode plate of a storage capacitor on the substrate layer; a buffer layer covering the light shielding metal layer and the first electrode plate on the substrate layer; an active layer and a second electrode plate of the storage capacitor on the buffer layer; a gate insulating layer on the buffer layer and the active layer, and a source, a gate and a drain on the gate insulating layer; wherein the source is connected to the light shielding metal layer through a first via hole; a second via hole and a third via hole are defined by the gate insulating layer, the source is connected to one side of the active layer through the second via hole, and the drain is connected to other side of the active layer through the third via hole; wherein widths of the source and the drain are both smaller than a width of the active layer, a range of a vertical distance between an edge of a projection of the source projected on the active layer and an edge of a projection of the second via hole projected on the active layer is greater than 0 and less than or equal to 2 microns, a range of a vertical distance between an edge of a projection of the drain projected on the active layer and an edge of a projection of the third via hole projected on the active layer is greater than 0 and less than or equal to 2 microns.

In the display panel provided in an embodiment of the present disclosure, material of the active layer is indium gallium zinc oxide.

In the display panel provided in an embodiment of the present disclosure, material of the first electrode plate is same as material of the light shielding metal layer.

In the display panel provided in an embodiment of the present disclosure, material of the first electrode plate is indium tin oxide.

In the display panel provided in an embodiment of the present disclosure, material of the second electrode plate is same as material of the source, the gate, or the drain.

In the display panel provided in an embodiment of the present disclosure, the display panel further includes a passivation layer located on the buffer layer and covering the second electrode plate, the source, the gate, and the drain; a color resist layer located on the passivation layer and corresponding to a light transmitting region of the display panel; a protective layer located on the passivation layer and covering the color resist layer; a pixel electrode layer located on the protective layer; and a pixel definition layer located on the protective layer and the pixel electrode layer, wherein the pixel electrode layer is connected to the source through a fourth via hole.

In the display panel provided in an embodiment of the present disclosure, the display panel further includes: an organic light emitting layer located on the pixel electrode layer; and a common electrode layer located on the organic light emitting layer and the pixel definition layer.

In the display panel provided in an embodiment of the present disclosure, material of the pixel definition layer is a hydrophobic material.

In the display panel provided in an embodiment of the present disclosure, material of the pixel definition layer is a non-hydrophobic material.

An embodiment of the present disclosure provides a method for preparing a display panel, including steps of: provide a substrate layer; preparing a light shielding metal layer and a first electrode plate of a storage capacitor on the substrate layer; preparing a buffer layer on the substrate layer, wherein the buffer layer covers the light shielding metal layer and the first electrode plate; preparing an active layer and a second electrode plate of the storage capacitor on the buffer layer; preparing a gate insulating layer on the buffer layer, wherein the gate insulating layer covers the active layer and the second electrode plate; etching the gate insulating layer and the buffer layer to form a first via hole, a second via hole, and a third via hole, respectively; conducting a first conductorization of regions of the active layer corresponding to the second via hole and the third via hole; preparing a source, a gate, and a drain on the gate insulating layer, wherein the source is connected to the light shielding metal layer through the first via hole; the source is connected to one side of the active layer through the second via hole, and the drain is connected to other side of the active layer through the third via hole; wherein widths of the source and the drain are both smaller than a width of the active layer, wherein a range of a vertical distance between an edge of a projection of the source projected on the active layer and an edge of a projection of the second via hole projected on the active layer is greater than 0 and less than or equal to 2 microns, a range of a vertical distance between an edge of a projection of the drain projected on the active layer and an edge of a projection of the third via hole projected on the active layer is greater than 0 and less than or equal to 2 microns; removing regions of the gate insulating layer not covered by the source, the gate, and the drain; and conducting a second conductorization of the active layer.

In the method for preparing a display panel provided in an embodiment of the present disclosure, material of the active layer is indium gallium zinc oxide.

In the method for preparing a display panel provided in an embodiment of the present disclosure, the method further includes steps of: preparing a passivation layer on the buffer layer, wherein the passivation layer covers the second electrode plate, the source, the gate, and the drain; preparing a color resist layer on the passivation layer, wherein the color resist layer corresponds to a light transmitting region of the display panel; preparing a protective layer on the passivation layer, wherein the protective layer covers the color resist layer; etching the protective layer and the passivation layer to form a fourth via hole; preparing a pixel electrode layer on the protective layer, wherein the pixel electrode layer is connected to the source through the fourth via hole; and preparing a pixel definition layer on the protective layer and the pixel electrode layer.

In the method for preparing a display panel provided in an embodiment of the present disclosure, the method includes steps of: preparing an organic light emitting layer on the pixel electrode layer; and preparing a common electrode layer the organic light emitting layer and the pixel definition layer.

In the method for preparing a display panel provided in an embodiment of the present disclosure, material of the pixel definition layer is hydrophobic material.

In the method for preparing a display panel provided in an embodiment of the present disclosure, material of the pixel definition layer is non-hydrophobic material.

An embodiment of the present disclosure provides a display device including a driver chip and a display panel, wherein the display panel comprises: a substrate layer; a light shielding metal layer and a first electrode plate of a storage capacitor on the substrate layer; a buffer layer covering the light shielding metal layer and the first electrode plate on the substrate layer; an active layer and a second electrode plate of the storage capacitor on the buffer layer; a gate insulating layer on the buffer layer and the active layer, and a source, a gate and a drain on the gate insulating layer; wherein the source is connected to the light shielding metal layer through a first via hole; a second via hole and a third via hole are defined by the gate insulating layer, the source is connected to one side of the active layer through the second via hole, and the drain is connected to other side of the active layer through the third via hole; wherein widths of the source and the drain are both smaller than a width of the active layer, a range of a vertical distance between an edge of a projection of the source projected on the active layer and an edge of a projection of the second via hole projected on the active layer is greater than 0 and less than or equal to 2 microns, and a range of a vertical distance between an edge of a projection of the drain projected on the active layer and an edge of a projection of the third via hole projected on the active layer is greater than 0 and less than or equal to 2 microns.

In the display device provided in an embodiment of the present disclosure, material of the active layer is indium gallium zinc oxide.

In the display device provided in an embodiment of the present disclosure, the display device further including: a passivation layer located on the buffer layer and covering the second electrode plate, the source, the gate, and the drain; a color resist layer located on the passivation layer and corresponding to a light transmitting region of the display panel; a protective layer located on the passivation layer and covering the color resist layer; a pixel electrode layer located on the protective layer; and a pixel definition layer located on the protective layer and the pixel electrode layer, wherein the pixel electrode layer is connected to the source through a fourth via hole.

In the display device provided in an embodiment of the present disclosure, material of the pixel definition layer is hydrophobic material.

In the display device provided in an embodiment of the present disclosure, material of the pixel definition layer is non-hydrophobic material.

Technical Effect

A display panel provided by an embodiment of the present disclosure has a source and a drain both of which have a width smaller than that of the active layer. By increasing a conductorized area of the active layer, paths of the active layer contacting edges of the source and the drain increase. By using a lateral diffusion phenomenon when the active layer is conductorized, the edge contact quality of the source, the drain, and the active layer is enhanced, thereby greatly improving conduction characteristics of the thin film transistor, improving and optimizing conduction performances of the source, the drain and the active layer in the thin film transistor in which the source, the gate, and the drain are prepared in a same layer. Mass production can be realized.

BRIEF DESCRIPTION OF THE SEVERAL
VIEWS OF THE DRAWINGS

DESCRIPTION OF SPECIFIC EMBODIMENTS
OF THE INVENTION

In order to make the purpose, the technical solution and the effects of the present disclosure clear, the present disclosure is described in further detail below with reference to the accompanying drawings and embodiments. It should be understood that the specific embodiments described herein are only used to explain the present disclosure, and are not used to limit the present disclosure.

Figure 1:
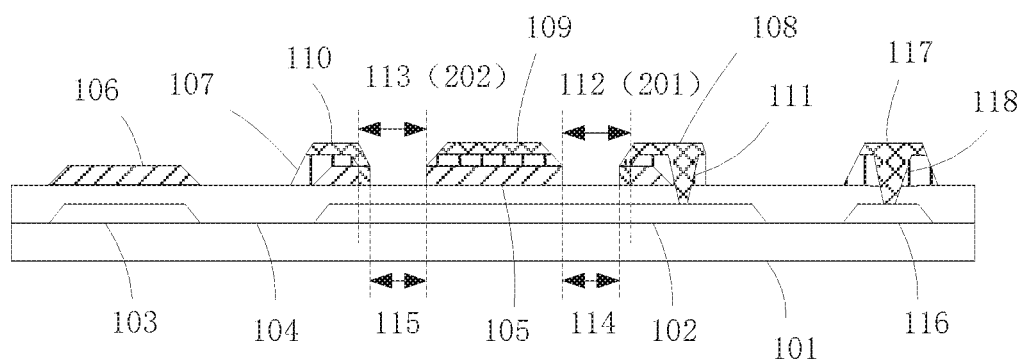
FIG. 1 is a schematic diagram of a basic structure of a display panel provided in a first embodiment of the present disclosure.

Refer to FIG. 1, which is a schematic diagram of a basic structure of a display panel provided in a first embodiment of the present disclosure. From the figure, the components of the present disclosure and the relative positional relationship between the components can be seen intuitively. The display panel includes a substrate layer 101; a light shielding metal layer 102 and a first electrode plate 103 of a storage capacitor on the substrate layer 101; a buffer layer 104 covering the light shielding metal layer 102 and the first electrode plate 103 on the substrate layer 101; an active layer 105 and a second electrode plate 106 of the storage capacitor on the buffer layer 104; a gate insulating layer 107 on the buffer layer 104 and the active layer 105; and a source 108, a gate 109 and a drain 110 on the gate insulating layer 107; wherein the source 108 is connected to the light shielding metal layer 102 through a first via hole 111. A second via hole 112 and a third via hole 113 are defined by the gate insulating layer 107, the source 108 is connected to one side of the active layer 105 through the second via hole 112, and the drain 110 is connected to other side of the active layer 105 through the third via hole 113.

It should be noted that because materials of the source 108, the gate 109, and the drain 110 are low-impedance metals, dry etching cannot be used. During a wet etching process, a metal etching solution continuously contacts the active layer 105, thereby etching regions 114 and 115 of the active layer 105 not covered by the gate insulating layer 107, the source 108, the gate 109, and the drain 110 in the second via hole 112 and the third via hole 113.

In one embodiment, material of the active layer 105 is indium gallium zinc oxide.

In one embodiment, the display panel may be equipped with transparent capacitors or not. In some embodiments, the electrode plate of the storage capacitor may be composed of either a pixel electrode or a light shielding metal layer in combination with metal of the source, the gate or the drain. Other adjusted structural capacitors designed according to the display panel provided in this embodiment are all within the protection scopes of the embodiments of the present disclosure.

In one embodiment, the display panel further includes a second light shielding metal layer 116 and a second gate 117, and the second gate 117 is connected to the second light shielding metal layer 116 through a fifth via 118.

Figure 2:
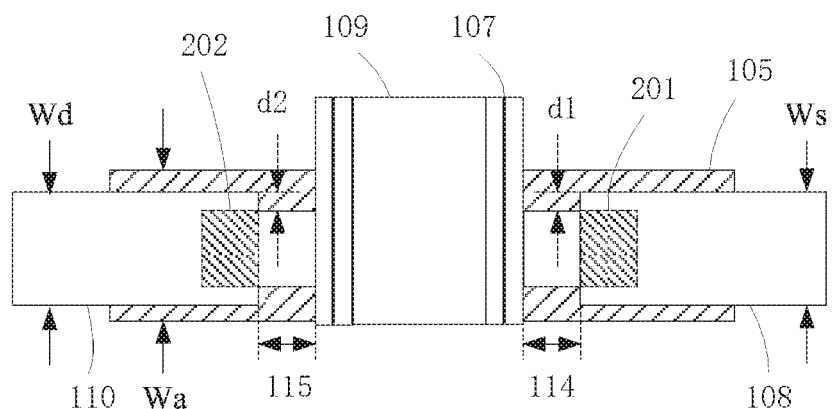
FIG. 2 is a top view of a partial structure of a display panel provided in a first embodiment of the present disclosure.

Continue to refer to FIG. 2, which is a top view of a partial structure of a display panel provided in a first embodiment of the present disclosure. The display panel includes an active layer 105, a gate insulating layer 107, a source 108, a gate 109 and a drain 110. In FIG. 1, a projection of the second via hole projected on the active layer 105 is a first region 201, and in FIG. 1, a projection of the third via hole projected on the active layer 105 is the second region 202.

In this embodiment, widths Ws and Wd of the source 108 and the drain 110 are both smaller than width Wa of the active layer 105. A range of a vertical distance d1 between an edge of a projection of the source 108 projected on the active layer 105 and an edge of the first region 201 is greater than 0 and less than or equal to 2 microns. A range of a vertical distance d2 between an edge of a projection of the drain 110 projected on the active layer 105 and an edge of the second region 202 is greater than 0 and less than or equal to 2 microns.

It should be noted that, in the display panel provided in this embodiment, the widths Ws and Wd of the source and drain are smaller than the width Wa of the active layer. When the active layer is being conductorized, regions of the active layer not covered by the source and the drain can be conductorized, thereby increasing the conductorized area of the active layer, so that paths of the active layer contacting edges of the source and the drain increase. By using lateral diffusion phenomenon when the active layer is conductorized, the edge contact quality of the source, the drain, and the active layer is enhanced, thereby greatly improving conduction characteristics of the thin film transistor.

Figure 3A:
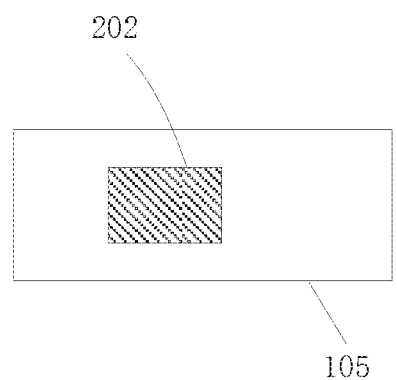
FIG. 3A, FIG. 3B and FIG. 3C are schematic diagrams of a conductorization process of an active layer of a display panel provided in a first embodiment of the present disclosure.
Figure 3B:
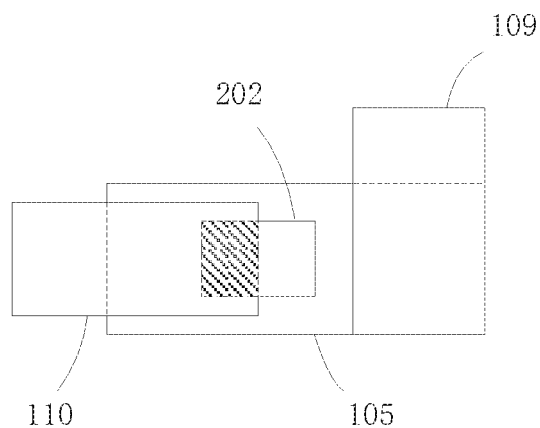
Figure 3C:
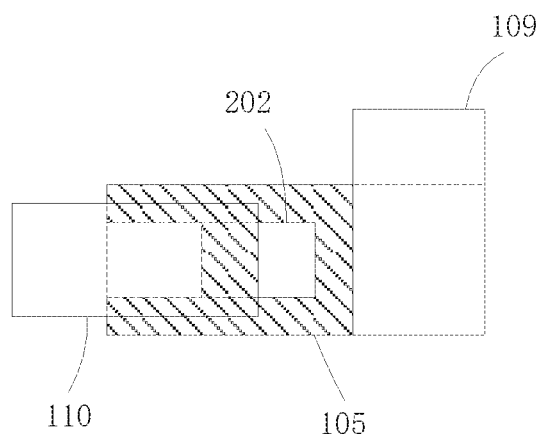

Specifically, refer to FIG. 3a to FIG. 3c, which are schematic diagrams of a conductorization process of an active layer of a display panel provided in the first embodiment of the present disclosure. The contact area between the drain 110 and the active layer 105 is taken as an example. After the gate insulating layer (not shown in the figure) is etched to form a via hole, as shown in FIG. 3a, a first conductorization is conducted on the second region 202 of the active layer 105 corresponding to the via hole.

After the first conductorization is completed, the source (not shown in the figure), the gate 109, and the drain 110 are prepared on the gate insulating layer (not shown in the figure), wherein the drain 110 passes through the via hole, and is in contact with the active layer 105, and the contact area is the shaded region in FIG. 3b. Because the materials of the source (not shown in the figure), the gate 109, and the drain 110 are low-impedance metals, dry etching cannot be used. During a wet etching process, a metal etching solution continuously contacts the active layer 105, thereby etching regions not covered by the gate insulating layer (not shown in the figure) and the drain 110 (that is the non-shaded region) in the second region 202.

As shown in FIG. 3c, a second conductorization is continuously conducted on the active layer 105. Because the width of the drain 110 is smaller than the width of the active layer 105, three edges of the drain 110 contact the active layer 105, and, that is, the contact paths increase. Moreover, the range of the vertical distance between an edge of the projection of the drain 110 projected on the active layer 105 and the edge of the projection of the second region 202 projected on the active layer is greater than 0 and less than or equal to 2 microns. A lateral diffusion phenomenon occurs to the active layer 105 during conductorization, and the diffusion range is generally about 2 microns, thereby conductorizing parts of the active layer 105 which contact the upper edge and the lower edge of the drain 110, and reducing contact resistance. Furthermore, the parts overlapped by the upper edge and the lower edge can be connected to the previously conductorized shaded region in the second area 202. That is, the conductorized area of the parts of the active layer 105 contacting the drain is increased, forms the complete conductorized paths, and improves the conduction characteristics of the thin film transistor. In other embodiments, the principle of increasing the contact area between the source and the active layer is the same as that of this embodiment, and is not described in detail below.

Figure 4:
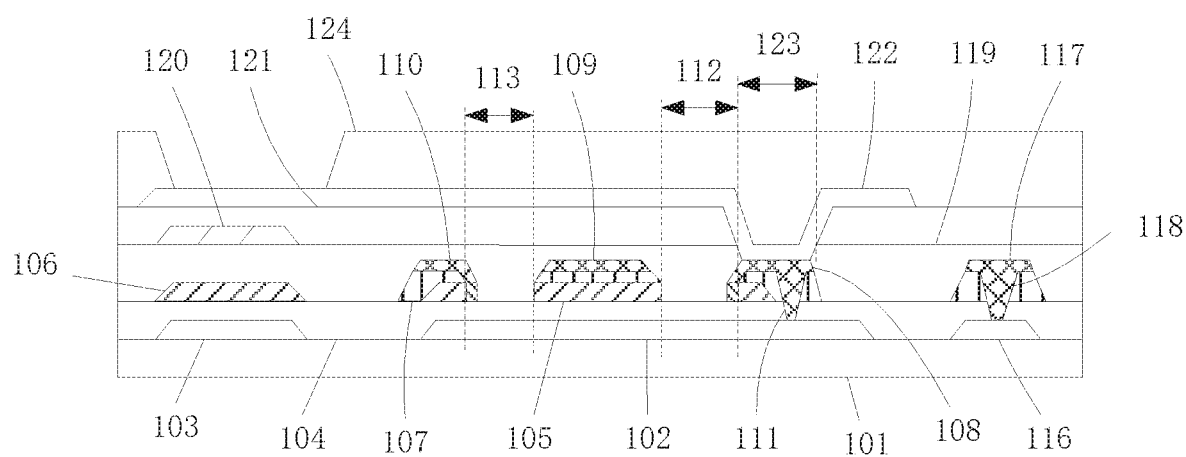
FIG. 4 is a schematic diagram of a basic structure of a display panel provided in a second embodiment of the present disclosure.

Refer to FIG. 4, which is a schematic diagram of a basic structure of a display panel provided in a second embodiment of the present disclosure. From the figure, the components of the present disclosure and the relative positional relationship between the components can be seen intuitively. The display panel includes a substrate layer 101; a light shielding metal layer 102 and a first electrode plate 103 of a storage capacitor on the substrate layer 101; a buffer layer 104 covering the light shielding metal layer 102 and the first electrode plate 103 on the substrate layer 101; an active layer 105 and a second electrode plate 106 of the storage capacitor on the buffer layer 104; a gate insulating layer 107 on the buffer layer 104 and the active layer 105; and a source 108, a gate 109, and a drain 110 on the gate insulating layer 107; wherein the source 108 is connected to the light shielding metal layer 102 through a first via hole 111. A second via hole 112 and a third via hole 113 are defined by the gate insulating layer 107, the source 108 is connected to one side of the active layer 105 through the second via hole 112, and the drain 110 is connected to other side of the active layer 105 through the third via hole 113.

It should be noted that because materials of the source 108, the gate 109, and the drain 110 are low-impedance metals, dry etching cannot be used. During a wet etching process, a metal etching solution continuously contacts the active layer 105, thereby etching the active layer 105 not covered by the gate insulating layer 107, the source 108, the gate 109, and the drain 110 in the second via hole 112 and the third via hole 113.

The display panel further includes a passivation layer 119 located on the buffer layer 104 and covering the second electrode plate 106, the source 108, the gate 109, and the drain 110; a color resist layer 120 located on the passivation layer 119 and corresponding to a light transmitting region of the display panel; a protective layer 121 located on the passivation layer 119 and covering the color resist layer 120; a pixel electrode layer 122 located on the protective layer 121; and a pixel definition layer 124 located on the protective layer 121 and the pixel electrode layer 122, wherein the pixel electrode layer 122 is connected to the source 108 through a fourth via hole 123.

Specifically, an organic light emitting layer and a common electrode layer may further disposed on the pixel electrode layer 122 exposed by the pixel definition layer 124, which are not the technical focus of the present disclosure, and therefore is not described in detail.

Similar to the embodiment of FIG. 2, in this embodiment, the widths of the source 108 and the drain 110 are both smaller than width of the active layer 105. A range of a vertical distance between an edge of a projection of the source 108 projected on the active layer 105 and an edge of the second via hole 112 is greater than 0 and less than or equal to 2 microns. A range of a vertical distance between an edge of a projection of the drain 110 projected on the active layer 105 and an edge of the third via hole 113 is greater than 0 and less than or equal to 2 microns.

In one embodiment, the display panel further includes a second light shielding metal layer 116 and a second gate 117, and the second gate 117 is connected to the second light shielding metal layer 116 through a fifth via hole 118.

In one embodiment, the material of the pixel definition layer 124 is a hydrophobic material. That is, the display panel may employ an inkjet printing technology to form an organic light emitting layer, and the corresponding organic light emitting material is organic light emitting ink.

In one embodiment, the material of the pixel definition layer 124 is a non-hydrophobic material. That is, the display panel may employ an evaporation technology to form an organic light emitting layer, and the corresponding organic light emitting material is an evaporation-type organic material.

Figure 5:
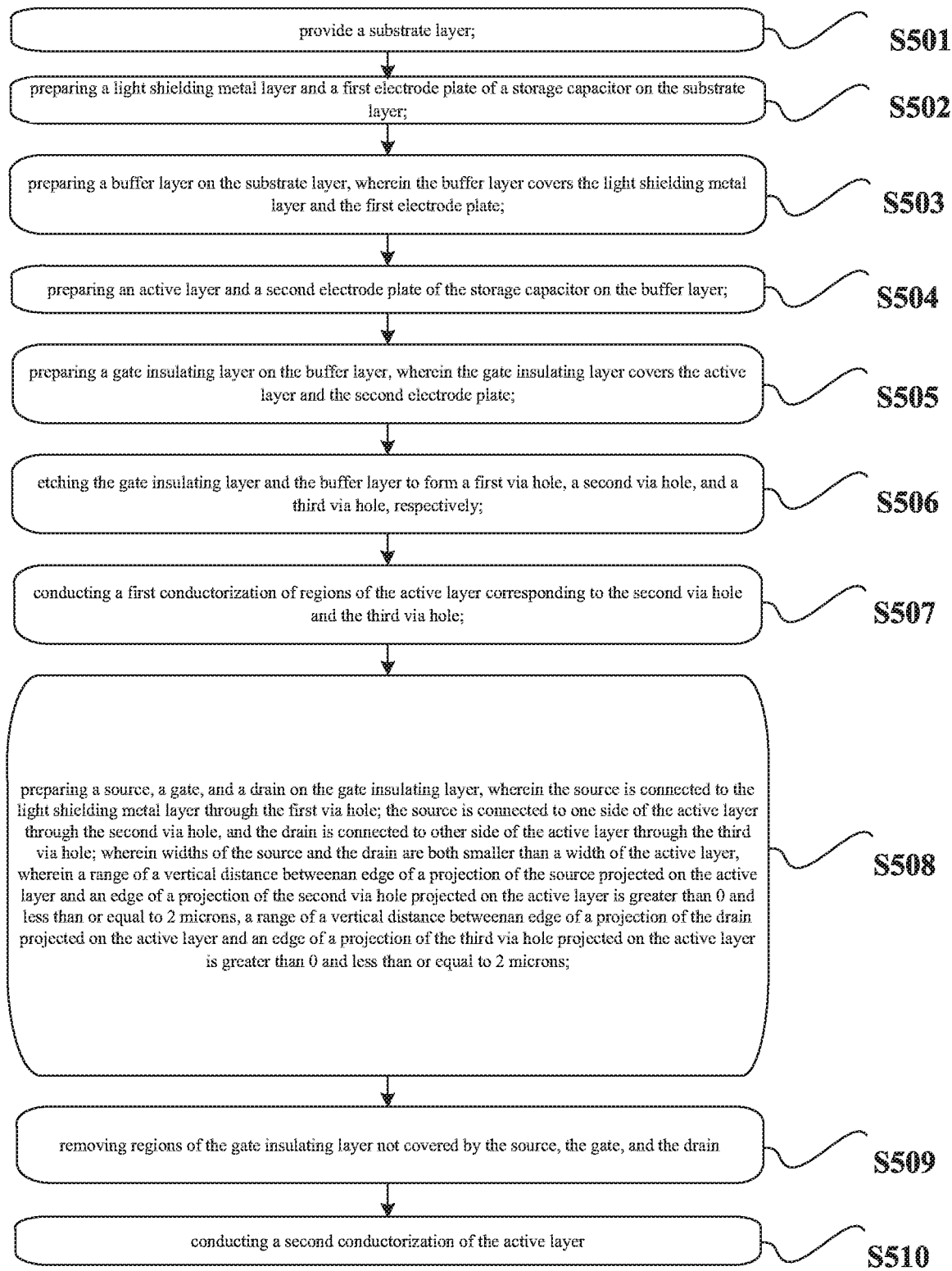
FIG. 5 is a flowchart of a method for preparing a display panel provided in a first of the present disclosure.

Refer to FIG. 5, which is a flowchart of a method for preparing a display panel provided in a first of the present disclosure. The preparing method including:

step S501 of providing a substrate layer;

step S502 of preparing a light shielding metal layer and a first electrode plate of a storage capacitor on the substrate layer;

step S503 of preparing a buffer layer on the substrate layer, wherein the buffer layer covers the light shielding metal layer and the first electrode plate;

step S504 of preparing an active layer and a second electrode plate of the storage capacitor on the buffer layer;

step S505 of preparing a gate insulating layer on the buffer layer, wherein the gate insulating layer covers the active layer and the second electrode plate;

step S506 of etching the gate insulating layer and the buffer layer to form a first via hole, a second via hole, and a third via hole, respectively;

step S507 of conducting a first conductorization of regions of the active layer corresponding to the second via hole and the third via hole;

step S508 of preparing a source, a gate, and a drain on the gate insulating layer, wherein the source is connected to the light shielding metal layer through the first via hole; the source is connected to one side of the active layer through the second via hole, and the drain is connected to other side of the active layer through the third via hole; wherein widths of the source and the drain are both smaller than a width of the active layer, wherein a range of a vertical distance between an edge of a projection of the source projected on the active layer and an edge of a projection of the second via hole projected on the active layer is greater than 0 and less than or equal to 2 microns, a range of a vertical distance between an edge of a projection of the drain projected on the active layer and an edge of a projection of the third via hole projected on the active layer is greater than 0 and less than or equal to 2 microns;

step S509 of removing regions of the gate insulating layer not covered by the source, the gate, and the drain; and step S510 of conducting a second conductorization of the active layer.

For the specific conductorization process, refer to the description in FIG. 3a-3c.

In an embodiment, the material of the active layer is indium gallium zinc oxide.

In an embodiment, the method for preparing a display panel further comprising steps of: preparing a passivation layer on the buffer layer, wherein the passivation layer covers the second electrode plate, the source, the gate, and the drain; preparing a color resist layer on the passivation layer, wherein the color resist layer corresponds to a light transmitting region of the display panel; preparing a protective layer on the passivation layer, wherein the protective layer covers the color resist layer; etching the protective layer and the passivation layer to form a fourth via hole; preparing a pixel electrode layer on the protective layer, wherein the pixel electrode layer is connected to the source through the fourth via hole; and preparing a pixel definition layer on the protective layer and the pixel electrode layer.

In one embodiment, the material of the pixel definition layer is a hydrophobic material. That is, the display panel may employ an inkjet printing technology to form an organic light emitting layer, and the corresponding organic light emitting material is organic light emitting ink.

In one embodiment, the material of the pixel definition layer is a non-hydrophobic material. That is, the display panel may employ an evaporation technology to form an organic light-emitting layer, and the corresponding organic light emitting material is an evaporation-type organic material.

An embodiment of the present disclosure further provides a display device, including a driver chip and the above-mentioned display panel. The display device provided in the embodiments of the present disclosure may be any product or component having a display function, such as a mobile phone, a tablet computer, a television, a display, a notebook computer, a digital camera, a navigator, and the like.

A display panel provided by an embodiment of the present disclosure has a source and a drain both of which have a width smaller than that of the active layer. By increasing a conductorized area of the active layer, paths of the active layer contacting edges of the source and the drain increase. By using a lateral diffusion phenomenon when the active layer is conductorized, the edge contact quality of the source, the drain, and the active layer is enhanced, thereby greatly improving conduction characteristics of the thin film transistor, improving and optimizing conduction performances of the source, the drain and the active layer in the thin film transistor in which the source, the gate, and the drain are prepared in a same layer. Mass production can be realized. The technical problem of a conventional display panel is resolved that during a wet etching process, a metal etching solution continuously contacts the active layer, resulting in serious damage to a thickness of the active layer, contact resistance, etc. The active layer is subjected to the dry etching processes of the gate insulating layer twice, thereby also damaging the active layer, making the source, the drain and the active layer fail to conduct, and failing to achieve the function of the thin film transistor.

It can be understood that, for those of ordinary skill in the art, equivalent replacements or changes can be made according to the technical solutions and the inventive concepts of the present disclosure, and all such changes or replacements should fall within the protection scopes of the claims appended to the present disclosure.

What is claimed is:

1. A display panel comprising:
    a substrate layer;
    a light shielding metal layer and a first electrode plate of a storage capacitor on the substrate layer;
    a buffer layer covering the light shielding metal layer and the first electrode plate on the substrate layer;
    an active layer and a second electrode plate of the storage capacitor on the buffer layer;
    a gate insulating layer on the buffer layer and the active layer, and
    a source, a gate and a drain on the gate insulating layer;
    wherein the source is connected to the light shielding metal layer through a first via hole;
    a second via hole and a third via hole are defined by the gate insulating layer, the source is connected to one side of the active layer through the second via hole, and the drain is connected to other side of the active layer through the third via hole;
    wherein widths of the source and the drain are both smaller than a width of the active layer,
    a range of a vertical distance between an edge of a projection of the source projected on the active layer and an edge of a projection of the second via hole projected on the active layer is greater than 0 and less than or equal to 2 microns,
    a range of a vertical distance between an edge of a projection of the drain projected on the active layer and an edge of a projection of the third via hole projected on the active layer is greater than 0 and less than or equal to 2 microns.

2. The display panel as claimed in claim 1, wherein material of the active layer is indium gallium zinc oxide.

3. The display panel as claimed in claim 1, wherein material of the first electrode plate is same as material of the light shielding metal layer.

4. The display panel as claimed in claim 1, wherein material of the first electrode plate is indium tin oxide.

5. The display panel as claimed in claim 1, wherein material of the second electrode plate is same as material of the source, the gate, or the drain.

6. The display panel as claimed in claim 1, further comprising
    a passivation layer located on the buffer layer and covering the second electrode plate, the source, the gate, and the drain;
    a color resist layer located on the passivation layer and corresponding to a light transmitting region of the display panel;
    a protective layer located on the passivation layer and covering the color resist layer;
    a pixel electrode layer located on the protective layer; and
    a pixel definition layer located on the protective layer and the pixel electrode layer, wherein the pixel electrode layer is connected to the source through a fourth via hole.

7. The display panel as claimed in claim 6, further comprising:
    an organic light emitting layer located on the pixel electrode layer; and
    a common electrode layer located on the organic light emitting layer and the pixel definition layer.

8. The display panel as claimed in claim 6, wherein material of the pixel definition layer is a hydrophobic material.

9. The display panel as claimed in claim 6, wherein material of the pixel definition layer is a non-hydrophobic material.

10. A method for preparing a display panel, comprising steps of:
    provide a substrate layer;
    preparing a light shielding metal layer and a first electrode plate of a storage capacitor on the substrate layer;
    preparing a buffer layer on the substrate layer, wherein the buffer layer covers the light shielding metal layer and the first electrode plate;
    preparing an active layer and a second electrode plate of the storage capacitor on the buffer layer;
    preparing a gate insulating layer on the buffer layer, wherein the gate insulating layer covers the active layer and the second electrode plate;
    etching the gate insulating layer and the buffer layer to form a first via hole, a second via hole, and a third via hole, respectively;
    conducting a first conductorization of regions of the active layer corresponding to the second via hole and the third via hole;
    preparing a source, a gate, and a drain on the gate insulating layer, wherein the source is connected to the light shielding metal layer through the first via hole; the source is connected to one side of the active layer through the second via hole, and the drain is connected to other side of the active layer through the third via hole;
wherein widths of the source and the drain are both smaller than a width of the active layer,
wherein a range of a vertical distance between an edge of a projection of the source projected on the active layer and an edge of a projection of the second via hole projected on the active layer is greater than 0 and less than or equal to 2 microns,
a range of a vertical distance between an edge of a projection of the drain projected on the active layer and an edge of a projection of the third via hole projected on the active layer is greater than 0 and less than or equal to 2 microns;
removing regions of the gate insulating layer not covered by the source, the gate, and the drain; and
conducting a second conductorization of the active layer.

11. The method for preparing a display panel as claimed in claim 10, wherein material of the active layer is indium gallium zinc oxide.

12. The method for preparing a display panel as claimed in claim 10, further comprising steps of:
preparing a passivation layer on the buffer layer, wherein the passivation layer covers the second electrode plate, the source, the gate, and the drain;
preparing a color resist layer on the passivation layer, wherein the color resist layer corresponds to a light transmitting region of the display panel;
preparing a protective layer on the passivation layer, wherein the protective layer covers the color resist layer;
etching the protective layer and the passivation layer to form a fourth via hole;
preparing a pixel electrode layer on the protective layer, wherein the pixel electrode layer is connected to the source through the fourth via hole; and
preparing a pixel definition layer on the protective layer and the pixel electrode layer.

13. The method for preparing a display panel as claimed in claim 12, further comprising steps of:
preparing an organic light emitting layer on the pixel electrode layer; and
preparing a common electrode layer the organic light emitting layer and the pixel definition layer.

14. The method for preparing a display panel as claimed in claim 12,
wherein material of the pixel definition layer is hydrophobic material.

15. The method for preparing a display panel as claimed in claim 12,
wherein material of the pixel definition layer is non-hydrophobic material.

16. A display device comprising a driver chip and a display panel, wherein the display panel comprises:
a substrate layer;
a light shielding metal layer and a first electrode plate of a storage capacitor on the substrate layer;
a buffer layer covering the light shielding metal layer and the first electrode plate on the substrate layer;
an active layer and a second electrode plate of the storage capacitor on the buffer layer;
a gate insulating layer on the buffer layer and the active layer, and
a source, a gate and a drain on the gate insulating layer;
wherein the source is connected to the light shielding metal layer through a first via hole;
a second via hole and a third via hole are defined by the gate insulating layer, the source is connected to one side of the active layer through the second via hole, and the drain is connected to other side of the active layer through the third via hole;
wherein widths of the source and the drain are both smaller than a width of the active layer, a range of a vertical distance between an edge of a projection of the source projected on the active layer and an edge of a projection of the second via hole projected on the active layer is greater than 0 and less than or equal to 2 microns, and a range of a vertical distance between an edge of a projection of the drain projected on the active layer and an edge of a projection of the third via hole projected on the active layer is greater than 0 and less than or equal to 2 microns.

17. The display device as claimed in claim 16, wherein material of the active layer is indium gallium zinc oxide.

18. The display device as claimed in claim 16, further comprising
a passivation layer located on the buffer layer and covering the second electrode plate, the source, the gate, and the drain;
a color resist layer located on the passivation layer and corresponding to a light transmitting region of the display panel;
a protective layer located on the passivation layer and covering the color resist layer;
a pixel electrode layer located on the protective layer; and
a pixel definition layer located on the protective layer and the pixel electrode layer, wherein the pixel electrode layer is connected to the source through a fourth via hole.

19. The display device as claimed in claim 18, wherein material of the pixel definition layer is hydrophobic material.

20. The display device as claimed in claim 18, wherein material of the pixel definition layer is non-hydrophobic material.

* * * * *